United States Patent [19]
Hébert

[11] Patent Number: 5,306,649
[45] Date of Patent: Apr. 26, 1994

[54] METHOD FOR PRODUCING A FULLY WALLED EMITTER-BASE STRUCTURE IN A BIPOLAR TRANSISTOR

[75] Inventor: Francois Hébert, Sunnyvale, Calif.

[73] Assignee: Avantek, Inc., Milpitas, Calif.

[21] Appl. No.: 982,226

[22] Filed: Nov. 25, 1992

Related U.S. Application Data

[62] Division of Ser. No. 736,743, Jul. 26, 1991, abandoned.

[51] Int. Cl.$^5$ .................... H01L 21/265; H01L 29/70
[52] U.S. Cl. ........................................ 437/31; 437/59; 148/DIG. 11
[58] Field of Search ...................... 437/31, 59

[56] References Cited

U.S. PATENT DOCUMENTS

| | | | |
|---|---|---|---|
| 3,197,681 | 7/1965 | Broussard | 317/235 |
| 3,586,542 | 6/1971 | MacRae | 148/1.5 |
| 3,615,939 | 10/1971 | Scneider | 148/187 |
| 3,826,699 | 7/1974 | Sawazaki et al. | 148/175 |
| 4,704,786 | 11/1987 | Kub | 437/32 |
| 4,721,685 | 1/1988 | Lindenfelser et al. | 437/31 |
| 4,812,894 | 3/1989 | Nakamura et al. | 357/55 |
| 4,824,799 | 4/1989 | Komatsu | 437/162 |
| 4,847,670 | 7/1989 | Monkowski et al. | 357/34 |
| 4,927,775 | 5/1990 | Alvarez et al. | 437/31 |
| 4,997,775 | 3/1991 | Cook et al. | 148/11 |

OTHER PUBLICATIONS

Solheim, et al., "Design and Optimization of Novel Transistor Structures", Ph.D. Thesis, Chapter 5, University of Wateloo, 1988.

El-Diwany, et al., "Increased Current Gain and Suppression of Peripheral Base Currents in Silicided Self-Aligned Narrow-Width Polysilicon-Emitter Transistors of an Advanced BiCMOS Technology", IEEE, Electron Device Letters, vol. 9, No. 5, pp. 247-249, May 1988.

De Jong, et al., "Electron Recombination at the Silicided Base Contact of an Advanced Self-Aligned Polysilicon Emitter", IEEE Proceedings, 1988, Bi-Polar Circuits and Tech. Meeting, pp. 202-205, Minneapolis, Minn., Sep. 1988.

Van Es, et al., "PABLO vs. Double-Poly—A Comparison of Two High-Performance Bipolar Technologies" (1987).

(List continued on next page.)

*Primary Examiner*—Olik Chaudhuri
*Assistant Examiner*—Long Pham

[57] ABSTRACT

A self-aligned fully-walled monocrystalline silicon emitter-base structure for a bipolar transistor and methods for producing the structure are provided. The methods involve creating an oxide side wall surrounding a monocrystalline silicon emitter-base structure by first defining the emitter region in a base island region. Successive oxide layers are deposited on top of the emitter region and etched back to produce an oxide wall around the entire perimeter of the emitter region. In a preferred embodiment of the invention a metal silicide is also formed across the top of the base island region of the semiconductor outside of the emitter region. Since the extrinsic base region, outside of the oxide sidewalls, is entirely covered by a low resistance silicide film, the base contact area can be significantly reduced compared to prior art devices.

The process results in a fully-walled emitter-base structure made of monocrystalline silicon which exhibits improved high-frequency performance. The peripheral emitter-base capacitance is substantially decreased by the oxide walls which surround the emitter sides. Since the sides of the emitter are walled, no lateral current injection can occur. Bipolar transistors which employ the claimed process exhibit an increased emitter-base breakdown and a reduced forward tunneling current since high sidewall doping levels are eliminated.

20 Claims, 16 Drawing Sheets

OTHER PUBLICATIONS

Glenn, et al., "High-Speed Fully Self-Aligned Single-Crystal Contacted Silicon Bipolar Transistor", Electronics, Letters, vol. 26, No. 20, Sep. 27, 1990.

Huang, et al., "A High-Speed Bipolar Technology Featuring Self-Aligned Single-Poly Base and Submicrometer Emitter Contacts", IEEE, Electron Device Letters, vol. 11, No. 9, Sep. 1990.

"Low-Noise Bipolars Silence Noise in 18-GHz YIG Source", Microwaves and RF, pp. 153–154, Nov. 1988.

D. J. Roulston, "Base Etched Self-Aligned Transistor Technology (BESTT)", Bipolar Semiconductor Devices, McGraw-Hill Publishing Co., pp. 351–353 (date unknown).

Konaka, et al., "A 30-ps Si Bipolar IC Using Super Self-Aligned Process Technology", IEEE Trans. Electron Devices, vol. ED-33, pp. 526–531, Apr. 1986.

Tang, et al., "Subnanosecond Self-Aligned I$^2$L/MTL Circuits", IEEE Trans. Electron Devices, vol. ED-28, pp. 1370–1384, Aug. 1980.

Wolstenholme, et al., "An Invest. of the Thermal Stability of the Inter. Oxide in Polycrystalline Silicon Emitter Bipolar Trans. by Comparing Dev. Results with High-Resolution Electron Microscopy Ob.", J. Appl. Physics, vol. 61, pp. 225–233, Jan. 1, 1987.

E. H. Stevens, "Consequences of Contact Resistance in Very-Small-Geometry CML Gates", Microelectronics Journal, vol. 14, No. 5, pp. 15–20, 1983.

Chuang, et al., "On the Narrow-Emitter Effect of Advanced Shallow-Profile Bipolar Transistors", Nov. 1988.

Chantre, et al., "An Investigation of Nonideal Base Currents in Advanced Self-Aligned Etched-Polysilicon Emitter Bipolar Transistors", IEEE Transactions on Electron Devices, vol. 38, No. 6, pp. 1354–1361, Jun., 1991.

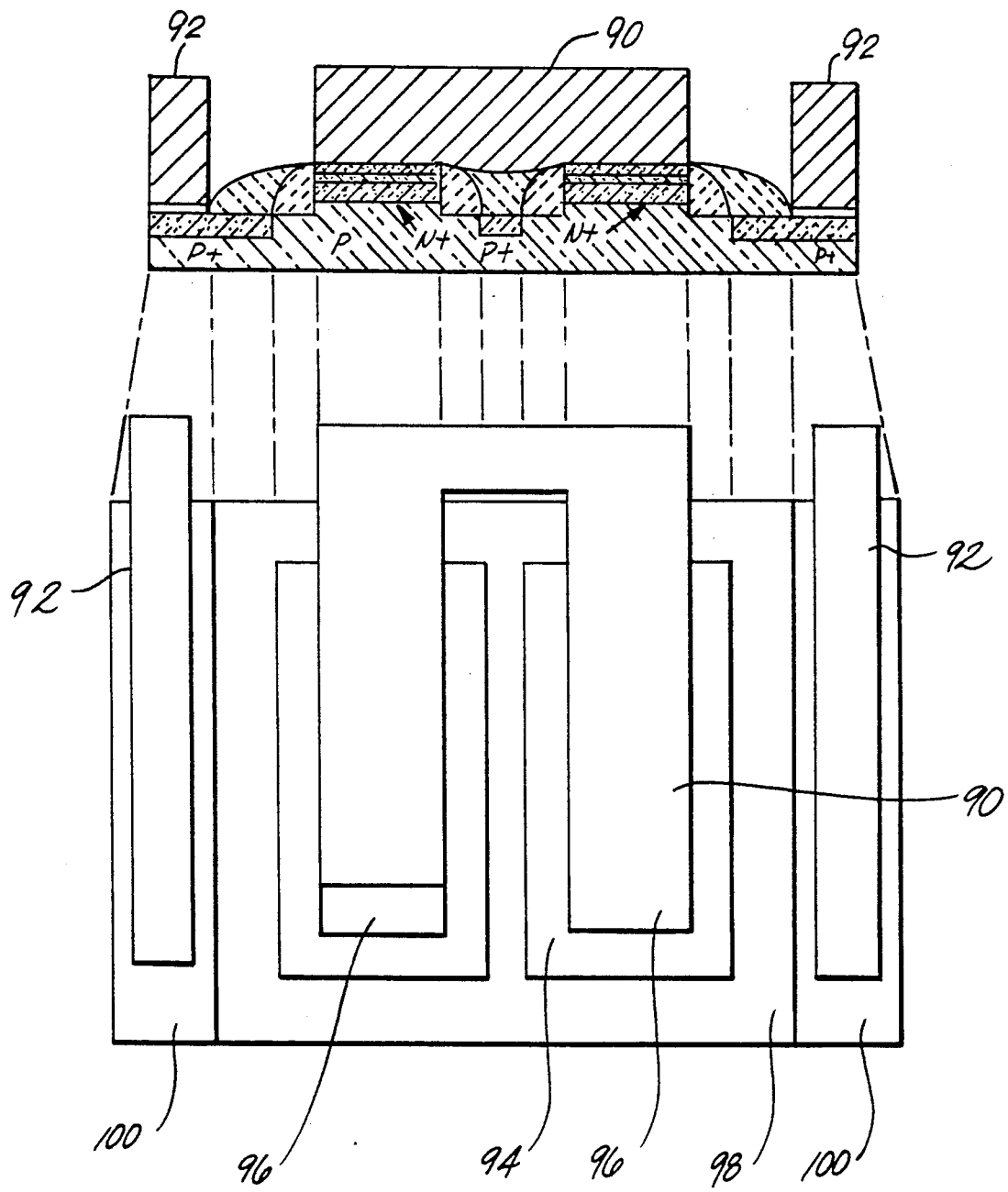

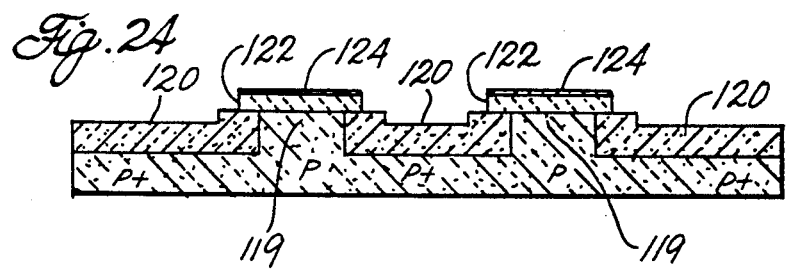
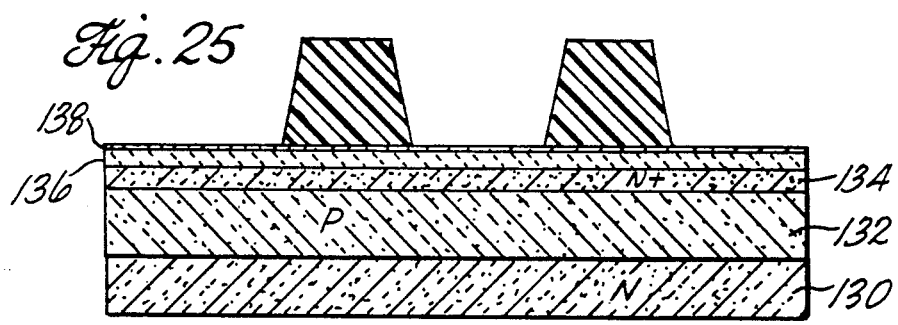
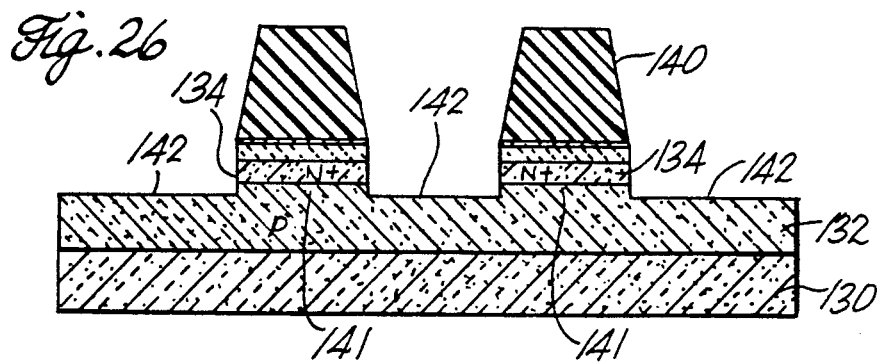

| Device | Measured Emitter-base capacitance (pico Farads) | |
|---|---|---|
| | 0 volts | 1 volt reverse bias |
| AT214 walled 214 | 0.69 0.31 to 0.38 | 0.47 0.22 to 0.26 |
| AT220 walled 220 | 0.98 0.45 to 0.51 | 0.68 0.32 to 0.36 |
| AT240 walled 240 | 1.97 0.90 to 0.91 | 1.46 0.64 to 0.65 |

FIGURE 34

METHOD FOR PRODUCING A FULLY WALLED EMITTER-BASE STRUCTURE IN A BIPOLAR TRANSISTOR

CROSS-REFERENCE TO RELATED APPLICATION

This is a division of application Ser. No. 07/736,743, filed Jul. 26, 1991, now abandoned.

FIELD OF THE INVENTION

The invention relates to semiconductors. In particular, the invention relates to a device and method for producing a fully walled monocrystalline silicon emitter-base structure for bipolar transistors.

BACKGROUND OF THE INVENTION

Various techniques for improving the high-frequency characteristics of bipolar semiconductor devices have been proposed. Most of the techniques are based on the use of a super self-aligned structure, wherein polycrystalline silicon is used as an electrode for contacting the base region. Konaka, S., et al., IEEE Trans. Electron Devices, Vol. ED-33, Apr., 1986, pp. 526-531. Other processes involve polycrystalline silicon contacted emitters, wherein a polycrystalline silicon layer is used to form a self-aligned emitter electrode. Tang, D.D., IEEE Trans. Electron Devices, Vol. ED28, Aug. 1980, pp. 1379-1384. Self-alignment processing techniques allow production of a transistor with smaller areas than is otherwise possible. A reduced transistor area results in a reduced device junction capacitance, which produces improved high-frequency characteristics.

Most prior self-aligned transistor devices have polycrystalline silicon emitters. The use of polycrystalline silicon has certain drawbacks. For example, polycrystalline silicon exhibits increased emitter resistance due to the lower conductivity of polycrystalline silicon compared to monocrystalline silicon.

Another drawback is that polycrystalline silicon emitters exhibit increased emitter resistance due to the presence of an interfacial oxide or other interfacial contaminants which are inadvertently introduced between the poly and monocrystalline films. It is known that silicon quickly grows a native oxide when exposed to ambient air. Even after an oxide etch treatment, a residual oxide film is usually present. Wolstenholme, G.R., et al. Journal Applied Physics, Vol. 61, Jan. 1987, pp. 225-233. Any residual oxide, whether continuous, "balled-up" or broken-up, will impede current flow.

Polycrystalline silicon emitters typically have poor emitter-base voltage matching between transistors. For analog applications, a good base-emitter voltage match between transistors in the same circuit is often necessary. For example, such a match is necessary for operational amplifiers ("OPAMPS"). Variations in the polycrystalline silicon film, due to variability in the poly to monocrystalline interface, causes variable resistance, thus affecting the voltage. Emitter resistance is also a problem for digital applications. Stevens, E.H., Microelectronics Journal, Vol. 14, pp. 15-20 (1983).

Another problem with prior bipolar semiconductor devices is that they exhibit undesirably high emitter-base junction capacitance. Most high-frequency bipolar transistors including polycrystalline silicon contacted devices, typically have a portion of the emitter diffusion located in the monocrystalline base region. The emitter region may be broken-up in a planar or horizontal region which is usually directly under the emitter opening, and is typically defined by a peripheral sidewall. The plane of the emitter region component results in a plane emitter-base junction capacitance which is typically a function of the emitter area. The peripheral emitter component results in a peripheral or sidewall emitter-base junction capacitance which is a function of the emitter perimeter.

For high-frequency transistors such as for RF or microwave applications, the emitter perimeter to emitter area ratio (Ep/Ea) of the device is typically made large in order to minimize any current crowding effects and minimize the base resistance of the transistor. The total emitter area affects the total device current. The narrower the emitter finger, the lower the intrinsic base resistance.

The total emitter-base junction capacitance is a function of the entire emitter surface which forms a P-N (or N-P) junction with the base layer. A large emitter perimeter translates into large peripheral emitter-base components of capacitance, especially since the peripheral component of the emitter is usually cylindrical since the emitter is formed by implantation and/or diffusion.

Emitter-base capacitance affects the input impedance of transistors. It also affects the transition frequency ("$f_t$") of bipolar transistors, particularly at low currents, as shown by the following formula in which $f_t$ is the frequency at which the current gain of the transistor becomes unity; $V_t$ is the thermal voltage, typically 0.025 volt at room temperature; $I_c$ is the total collector current of the device; $C_{je}$ is the total emitter-base junction capacitance, both peripheral and planar; $C_{jc}$ is the base-collector junction capacitance; and $\tau_f$ is the sum of the internal delay times including base transit time, emitter delay, and collector space charge layer transit time:

$$1/(2\pi f_t) = (V_t/I_c)(c_{je} + C_{jc}) + \tau_f$$

The planar area of the emitter is the area where current injection takes place. The emitter's planar area affects the total device current. The larger the emitter area, the greater the injected current for a given emitter-base voltage. For a given device current, the only way of minimizing the emitter-base capacitance, aside from altering doping levels, is to reduce the peripheral or sidewall capacitance.

Most prior microwave silicon bipolar transistors have been fabricated using quasi-self-aligned schemes and are not fully walled. They are interdigitated transistors having multiple base and emitter contact stripes. These devices feature submicron emitter widths. Basawapatna, G., et al., Microwaves and RF, pp. 153-154 (Nov. 1988). The transistor described by Basawapatna is an NEC transistor having 0.6 um contact widths. The emitter is contacted with arsenic doped polycrystalline silicon. The emitter diffusion into the monocrystalline base region is not walled, meaning that the emitter-base junction is effectively composed of a sidewall and planar portions.

In non-walled bipolar transistors, a reduced performance results from lateral base widening effects. At high current densities, the lateral component of current injection becomes significant. Since the current is injected laterally, the effective base width is now wider than the base width directly under the planar emitter region which results in increased base transit time. Van der Ziel, A. et. al., Proceedings of the IEEE, Vol. 54, pp. 411–412 (Mar. 1976).

Fully or partially walled bipolar transistor emitters have been previously described. El-Diwany, et al., Increased Current Gain and Suppression of Peripheral Base Currents in Silicided Self-Aligned Narrow-Width Polysilicon-Emitter Transistors of an Advanced BiCMOS Technology, IEEE Electron Device Letters, Vol. 9, No. 5, pp. 247-249 (May, 1988). De Jong, et al., Electron recombination at the silicided base contact of an advanced self-aligned polysilicon emitter, Proceedings of the IEEE 1988 Bipolar Circuits and Technology Meeting, pp. 202-205, Minneapolis, Minn., (Sept., 1988). However, since the devices disclosed in these references employ polycrystalline silicon to contact the monocrystalline region of the emitter, they tend to exhibit the increased resistance and poor emitter-base voltage matching problems discussed above.

Several of the above mentioned polysilicon emitter devices feature silicided base and emitter contacts. Silicidation results in consumption of the silicon under and next to the deposited and thermally reacted refractory metal. In the case of bipolar transistors, silicidation of the emitter region has certain drawbacks. For shallow emitter junctions, the silicidation of the emitter regions results in a consumption of the actual emitter region which results in reduced current gain due to increased minority carrier injection in the emitter. Also, variations in the uniformity of the silicidation process will result in non-uniform consumption of the silicon in the emitter region which in turn will result in non-uniform transistor current gain. In the polysilicon devices described above, a thick polysilicon film must be used to avoid these drawbacks, at the expense of increased emitter resistance and increased emitter delay time.

SUMMARY OF THE INVENTION

An object of the present invention is to provide a process for producing a bipolar transistor structure which is self-aligned, employing a metal contacted monocrystalline silicon emitter region with a fully walled outer side surface, without using any polycrystalline or amorphous silicon. Another object of the invention is to provide a process for producing a fully walled emitter-base structure having a metal silicide over the extrinsic base region and optionally a separately optimized metal silicide over the emitter region. The claimed process allows production of a bipolar transistor structure having reduced parasitic capacitance, reduced emitter resistance, reduced lateral current injection, improved breakdown characteristics, and a low resistance extrinsic base region.

The claimed process is initiated by first providing a base island region on a semiconductor device having an epitaxial monocrystalline silicon layer under thin silicon oxide and silicon nitride layers. A base dopant is introduced into the monocrystalline silicon layer before or after the thin silicon oxide and silicon nitride layers are formed.

An emitter region is defined by lithographically patterning a photoresist mask on top of the oxide and nitride layers. The unmasked areas outside of the emitter region is referred to as the "extrinsic base region". The extrinsic base region is directionally etched until all of the oxide and nitride layers and part of the silicon layer is removed, so that the etching depth of the silicon layer corresponds to the desired emitter/base junction depth. The photoresist mask is removed leaving the oxide and nitride layers covering the emitter region.

Base dopant is introduced in the extrinsic base region. A first oxide film is deposited over the base island region. The first oxide film is directionally etched until an oxide sidewall is formed around the periphery of the emitter region. A base dopant is introduced in the extrinsic base region which is not covered by the oxide sidewall.

A second oxide film, which is thicker than the first oxide film is then deposited over the base island region. The upper surface of the second oxide film is planarized with a spin-on film. The spin-on film and the second oxide film are dry etched using a process which etches both the oxide film and the spin-on film at substantially the same rate, until the thin nitride layer over the emitter region is exposed. The remaining first and second oxide film materials are then thermally densified.

The oxide and nitride layers on top of the emitter region are selectively wet etched away. The emitter region is implanted. A base contact region is established and implanted. Electrodes are created over the emitter and base contact regions.

The process results in a fully-walled emitter-base structure made of monocrystalline silicon which exhibits improved high-frequency performance. The peripheral emitter-base capacitance is substantially eliminated by the oxide walls which surround the emitter sides. Since the sides of the emitter are walled, no lateral current injection can occur. A further advantage of walled emitters is an increased emitter-base breakdown and a reduced forward tunneling current since the high sidewall doping levels are eliminated. Since the monocrystalline silicon in the emitter region is metal contacted, the emitter resistance is decreased.

BRIEF DESCRIPTION OF THE DRAWINGS

FIG. 20 is a partial side sectional view of a finally processed bipolar transistor in a third embodiment of the present invention.

FIG. 21 is a partial top view of a finally processed bipolar transistor in a third embodiment of the present invention.

FIG. 24 is a partial side sectional view of a partially processed bipolar transistor after thermal oxidation of exposed silicon in a second variation of the fourth embodiment of the present invention.

FIG. 25 is a partial side sectional view of a partially processed bipolar transistor illustrating base and emitter ion implantation prior to emitter region definition in a fifth embodiment of the present invention.

FIG. 26 is a partial side sectional view of a partially processed bipolar transistor after etching around the photoresist mask to define the emitter region in the fifth embodiment of the present invention.

FIG. 34 is a table comparing emitter base capacitance measurements for walled and non-walled structures.

DETAILED DESCRIPTION OF THE PREFERRED EMBODIMENTS

The present invention includes a device having a fully walled emitter-base structure made of monocrystalline silicon and a method for producing the device. The preferred embodiments which are described below involve vertical NPN transistors. A discrete, as opposed to integrated or monolithic, version of the device is described for simplicity. However, those of ordinary skill in the art will recognize that an N+ subcollector region on a P-substrate could be substituted for an N+ substrate. An N+ collector reach-through or plug region could also be formed. In this case, an isolation scheme such as trench isolation could be used to integrate multiple transistors onto one chip.

Figure 1:
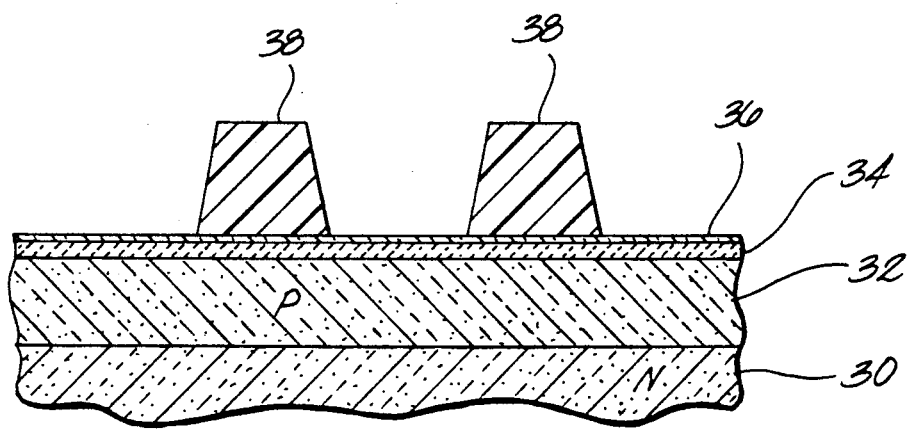
FIG. 1 is a partial side sectional view of a partially processed bipolar transistor after definition of the emitter region using a photoresist material in a first embodiment of the present invention.

In a first embodiment of the present invention, an N-type epitaxial collector layer 30, as shown in FIG. 1, is first grown on a highly doped N+ substrate. For example, an antimony doped substrate at a doping level of approximately 5E18 to 5E19 cm$^{-3}$ and an arsenic doped epitaxial collector layer work well for this purpose. The epitaxial layer 30 thickness and doping levels depend on the desired final transistor characteristics. For example, lower doping levels and thicker epitaxial layers cause higher collector-base, and collector-emitter, breakdown voltages, lower per-unit-area collector-base capacitance and lower transistor transition frequency, i.e. increased collector transit time delay. Typically, a doping level of 4E15 to 6E16 cm$^{-3}$ and a thickness of 0.3 to 5.0 μm may be used. Transistor sites are then defined by oxidizing the region outside the base island region of the transistor.

A thin thermal oxide layer ("THINOX") 34 is grown on the exposed monocrystalline silicon sites in the base island region 32. A thickness of the order of 150 to 250 angstroms, obtained using a dry oxidation process for example, is adequate.

A silicon nitride film ("NIT") 36 having a thickness of approximately 600 to 1000 angstroms is then deposited on the THINOX 34, using a low pressure chemical vapor deposition system ("LPCVD") or plasma enhanced chemical vapor deposition system ("PECVD"). The thickness of NIT 36 affects the base doping profile when the base ion implantation is carried out through the THINOX and NIT stacks.

Ion implantation of the base layer is carried out either before or after THINOX and NIT layer formation. Boron is implanted through the NIT 36 and THINOX 34 layers such that a base-collector depth of approximately 0.2 to 0.4 μm is obtained. Boron doses of approximately 5E13 to 5E14 cm$^{-3}$ with energies of approximately 20 to 60 KeV may be used.

A second silicon nitride layer (not shown) may optionally be deposited onto the NIT layer 36 using either LPCVD or PECVD. This layer will increase the thickness of the deposited silicon nitride and will permit control of the extrinsic base passivation independently of the emitter junction depth. A total silicon nitride thickness of approximately 1000 to 1800 angstroms is preferred. Alternatively, another material may be deposited on top of the NIT layer to act as a sacrificial etch stop layer in subsequent steps. For example, metal films such as TiW, TiSi2 and/or polycrystalline or amorphous silicon may be used for this purpose.

Figure 2:
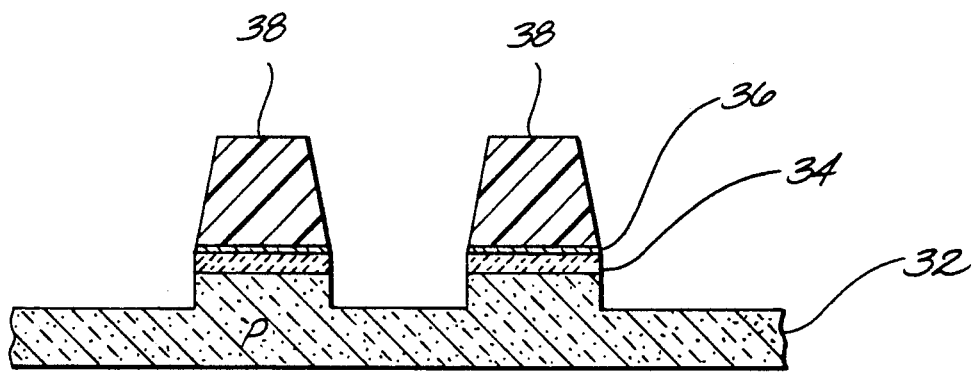
FIG. 2 is a partial side sectional view of a partially processed bipolar transistor after etching around the emitter region in a first embodiment of the present invention.

Next, the emitter fingers are defined. A photoresist mask 38 is lithographically patterned on top of the NIT 36 and THINOX 34 films. The NIT 36 and THINOX 34 films over the base layer 32, outside of the photoresist mask 38, are then entirely etched away, preferably using directional reactive ion etching ("RIE"). For example, CF$_4$+H$_2$ or CHF$_3$ etches NIT and THINOX stopping on silicon. Additionally, some of the monocrystalline silicon over the base region 32, outside of the mask 38, is etched, as shown in FIG. 2. For example, SiCl$_4$+Cl$_2$ or CF$_4$ etches silicon. The silicon is typically etched to a depth which is approximately equal to the final emitter junction depth. For example, 1000 to 2000 angstroms of silicon is etched.

The photoresist mask 38 is then removed. The total step height, including the etched silicon plus deposited NIT 36 and THINOX 34 layers, defines the effective thickness of what will become the extrinsic passivation layer, which will be discussed in more detail below.

A shallow boron implant is then carried out in a self-aligned fashion. The emitter area is protected by the NIT 36 and THINOX 34 layers. The boron implant reduces the base resistance of the extrinsic base region of the transistor. An implant dose of approximately 5E13 to 5E14 cm$^{-3}$ is adequate at an energy of 5 to 10 KeV. Alternatively, BF$_2$ at a higher energy can be used.

Figure 3:
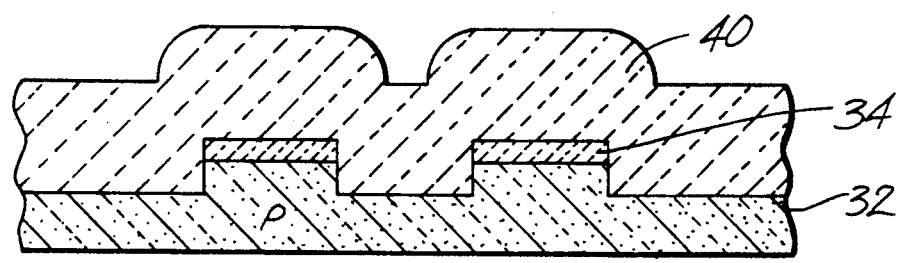
FIG. 3 is a partial side sectional view of a partially processed bipolar transistor after depositing an oxide layer in a first embodiment of the present invention.

An oxide film ("LTO-1") 40 is then deposited on the wafer, as shown in FIG. 3. A film thickness of approximately 1000 to 3000 angstroms, applied by LPCVD or PECVD, is adequate. It is preferable to use a conformal film such as LTO-410 liquid with O$_2$ gas (approximately 80-90% conformal) which is available from J.C. Schumacher of Carlsbad, Calif., or TEOS (tetraethyl orthosilicate) (C$_2$H$_5$O)4Si (approximately 80-90% conformal). Additionally, silane SiH$_4$ gas with O$_2$ gas (approximately 50-60% conformal) or TOMCATS tetramethylcyclotetrasiloxane, C$_4$H$_{16}$Si$_4$O$_4$, may be used.

At this point the LTO-1 oxide may be densified using dry or steam oxidation, preferably at a temperature of approximately 750° to 850° C., in order to improve emitter sidewall oxide characteristics such as defect levels and wet etch rate. The oxide densification does not affect the monocrystalline silicon in the emitter region which is protected from oxidation by the NIT layer.

Figure 4:
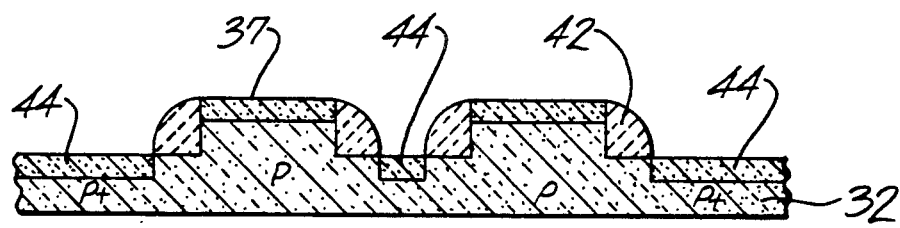
FIG. 4 is a partial side sectional view of a partially processed bipolar transistor having oxide sidewalls in a first embodiment of the present invention.

The wafer is then dry etched using directional RIE such that an oxide sidewall is formed around the periphery of the emitter area, as shown in FIG. 4. The RIE conditions should be such that the oxide etch rate is higher than that of nitride and silicon. For example, CF$_4$+H$_2$ or CHF$_3$ will work for this purpose.

Next, a layer of metal such as Ti, Ni, Co, or Pt is deposited using, for example, sputtering or evaporation over the entire wafer. Typically, sputtering may be used to deposit the metal, at a preferred thickness of approximately 300 to 1500 angstroms.

A shallow boron implant is then carried out to further reduce the resistance of the extrinsic base region. Boron difluoride or low energy boron is typically used at a dose of approximately 1E14 to 1E15 cm$^{-3}$. The implant is carried out in a self-aligned fashion since the NIT 36 and THINOX 34 layers protect the emitter region. Alternatively it has been discovered that it may be advantageous to perform the boron implant after the metal silicide reaction step described below.

The deposited metal is then reacted, preferably by heating, to form a silicide 44 in the monocrystalline silicon regions, as shown in FIG. 4. A temperature of approximately between 400 and 750° C. will work for this purpose. The unreacted metal is then selectively etched, using a technique which is appropriate for the particular metal. Such techniques are well known in the art. Finally, the silicide is preferably annealed at a temperature of approximately 800° to 900° C.

Figure 5:
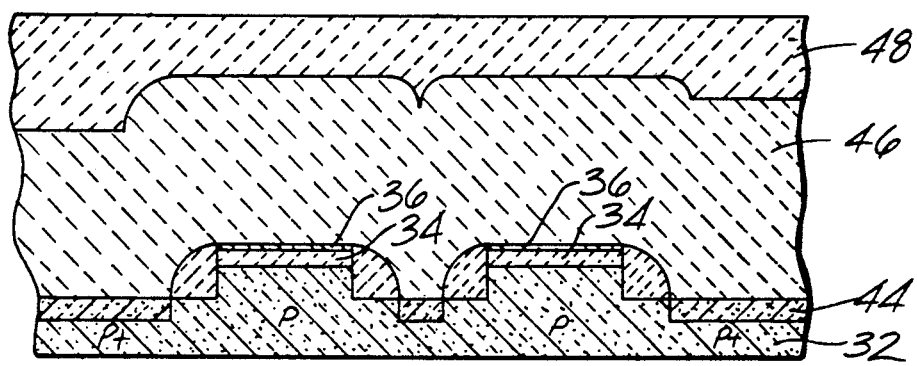
FIG. 5 is a partial side sectional view of a partially processed bipolar transistor having layers of a second oxide film and a flowable polymer in a first embodiment of the present invention.

A second oxide film ("LTO-2") 46, having a thickness of approximately 3000 to 9000 angstroms, is then deposited on the wafer, as shown in FIG. 5. The same oxide materials discussed above with reference to LTO-1 may be used to produce the second oxide film. Again it is preferable to use a conformal film. Any bumps or dips present in the LTO-2 film 46 due to the wafer's surface topography, are then planarized by applying a spin-on film 48 such as spin-on-glass ("SOG"). For example, SOG by Allied-Signal Inc., Milpitas, Calif., may be used. Other planarizing coatings are available from Futurrex Inc., Newton, N.J. Other photoresist materials, or a combination of the these materials may be used.

Figure 6:
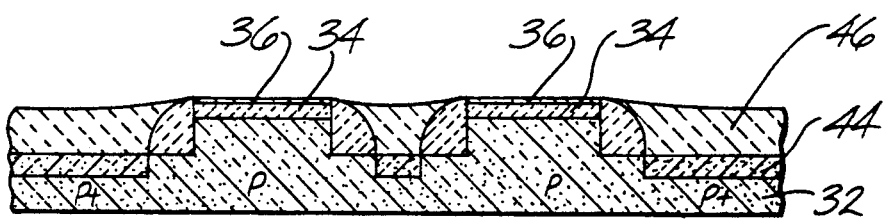
FIG. 6 is a partial side sectional view of a partially processed bipolar transistor after etching the second oxide layer in a first embodiment of the present invention.

Dry etch-back by RIE or plasma etching is then carried out until the top of the NIT layer 36 is exposed, as shown in FIG. 6. It is preferable to select an etching process which will etch the LTO-2 and planarizing coating at similar rates. For example, CHF$_3$+O$_2$, CF$_4$+O$_2$ or CF$_4$ alone are appropriate etchants for this purpose.

Since the emitter area is still covered by the NIT 36 and THINOX 34 films, the LTO-1 and LTO-2 films, which cover and passivate the extrinsic base region of the transistor, may be thermally densified in an oxidizing ambient. A dry oxygen or steam ambient treatment, at a temperature of approximately 800° to 900° C. is adequate to densify the LTO-1 and LTO-2 films without causing the base doping to diffuse. This step may be performed immediately after the LTO-2 film deposition.

Figure 7:
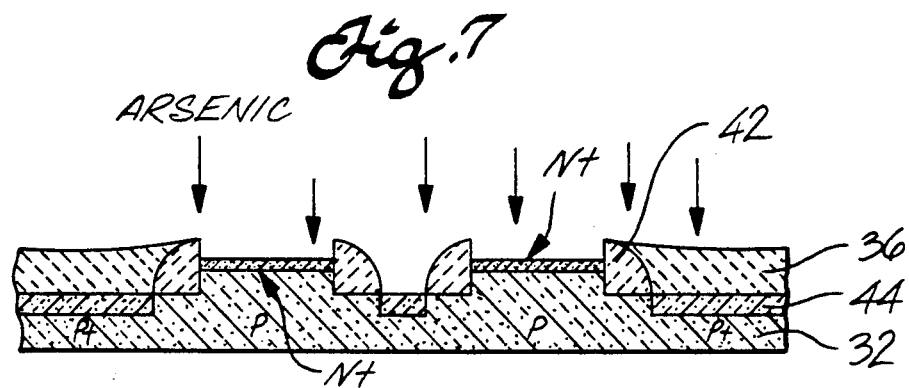
FIG. 7 is a partial side sectional view of a partially processed bipolar transistor showing ion implantation of the emitter region in a first embodiment of the present invention.

The NIT film 36 which covers the emitter area is then etched using selective wet or dry etching techniques, yielding the structure illustrated in FIG. 7. For example, H$_3$PO$_4$ works well as an etchant for this purpose.

At this point, since only the emitter area is exposed, optional silicided contacts to the emitter may be produced by following a process similar to that described for the extrinsic base silicidation, but optimized to achieve reproducible silicide thickness to obtain uniform device current gains. For example, Ti or Co may be sputtered at a thickness of approximately 150 to 500 A. This optional process step allows the uncoupled formation of silicides separately optimized for the extrinsic base region (lowest resistance) and emitter contacts (controlled and uniform thickness of the silicide), for achieving low contact resistances. This is possible since the extrinsic base silicide is formed while the emitter region is protected with a nitride film and since when the emitter area becomes exposed, the extrinsic base region is protected by oxide. For fully walled emitter-base structures having fully metal contacted emitter regions, silicidation of the emitter contacts may be less important.

The emitter is then ion-implanted (shown by arrows), for example, using arsenic at a dose of approximately 5E15 to 1E16 cm$^{-3}$. The implant is performed in a self-aligned fashion since the extrinsic base region 32 is covered by a thick oxide, i.e. LTO-2 36. Therefore, no mask is necessary.

Figure 8:
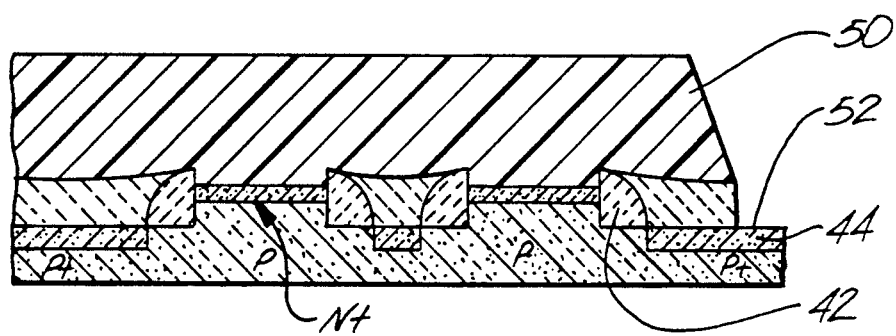
FIG. 8 is a partial side sectional view of a partially processed bipolar transistor having base contact photomasking in a first embodiment of the present invention.

A base contact is then patterned using a lithographically defined photoresist mask 50, as shown in FIG. 8, over the extrinsic base area to the side of the emitter-base structure. The LTO-2 film 36 is then etched by RIE using a process which does not etch the silicide, creating a base contact opening 52. A notable advantage of the silicide film 44 is realized at the stage of creating the base contact. Since the extrinsic base sheet resistance is entirely covered by a low resistance silicide, except for the LTO-1 sidewall 42 which surrounds the emitter, there is no need to have many or multiple base contacts, as has been previously required in the art. This allows a significant reduction in the base contact area for a given emitter area. The presence of the LTO-2 layer allows the emitter metal to be routed anywhere over the silicided extrinsic base region without resulting in emitter-base shorts due to the LTO-2 layer.

Figure 9:
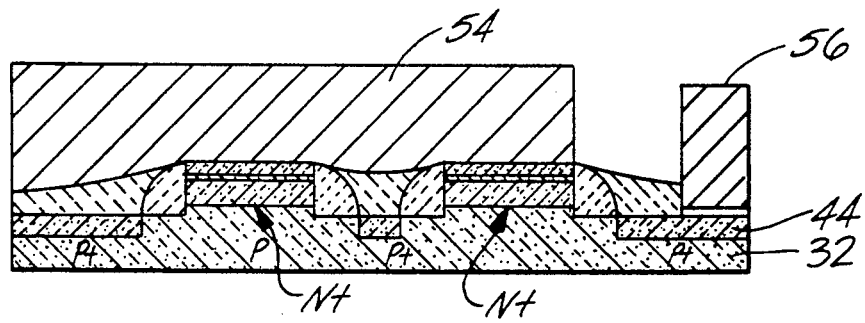
FIG. 9 is a partial side sectional view of a finally processed bipolar transistor in a first embodiment of the present invention.
Figure 10:
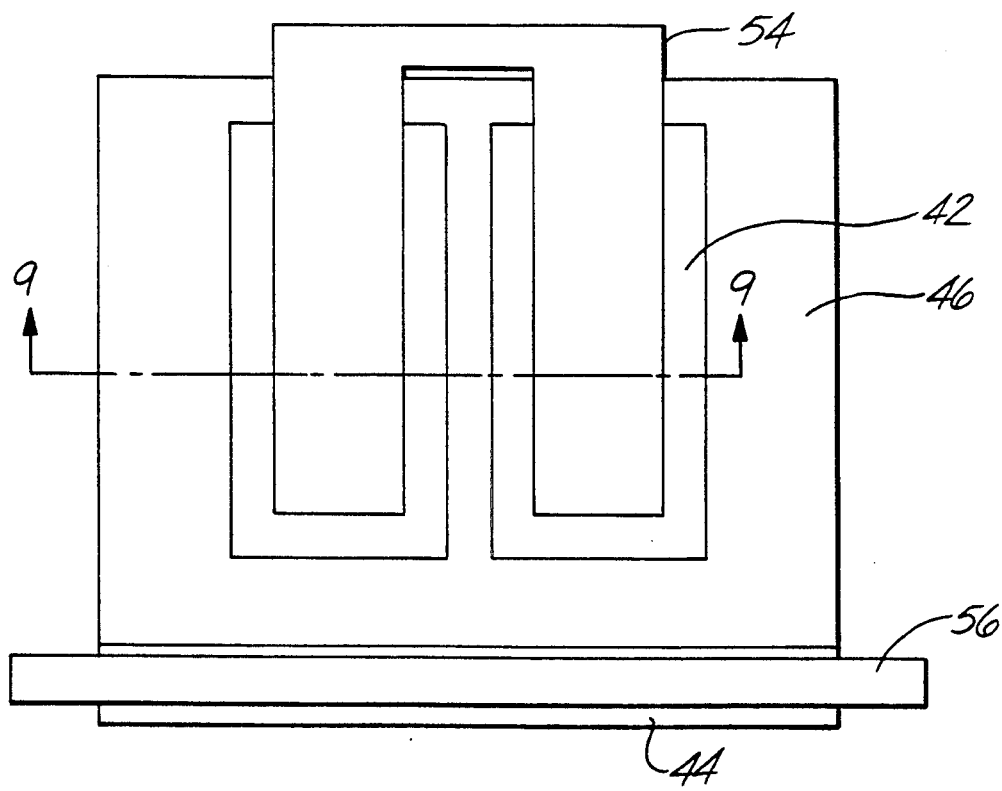
FIG. 10 is a partial top view of a finally processed bipolar transistor in a first embodiment of the present invention.
Figure 11:
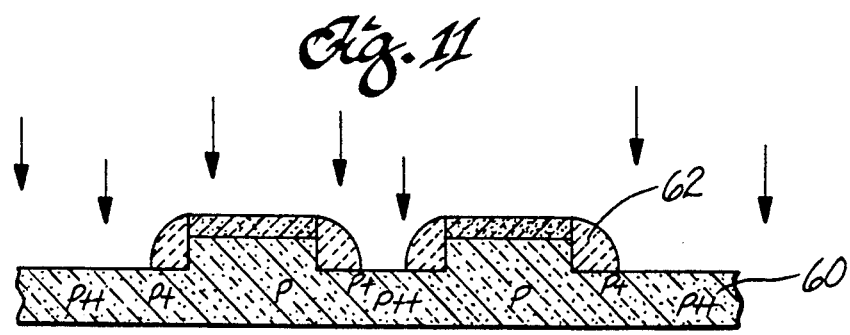
FIG. 11 is a partial side sectional view of a partially processed bipolar transistor showing ion implantation of the extrinsic base region in a second embodiment of the present invention.

FIGS. 9 and 10 illustrate the final configuration of the fully walled emitter-base structure after establishing the metal contacts. Following the base contact opening, the photoresist mask, 50 in FIG. 8, is removed. The wafers are cleaned and a diffusion step is carried out in order to drive-in the emitter junction, activate the emitter and base dopant atoms and anneal any ion implantation damage. It has been discovered that there may be some advantages in forming the base contact opening after the diffusion step. Standard furnace annealing or rapid thermal annealing may be employed, at a temperature of approximately 900° to 1100° C. After the annealing step, the THINOX 34 layer is etched. Standard metal electrodes 54 and 56 are then formed over the emitter and base contact regions.

FIGS. 11-16 illustrate a second embodiment of the present invention, in which a bipolar transistor having alternating base contact and emitter regions is produced. The process in the second embodiment of the invention is similar to the process of the first embodiment described above except that at least two photoresist patterns are used to lithographically define effective emitters over the base region. The steps of etching the NIT, THINOX and monocrystalline silicon in the extrinsic base region, implanting boron in the extrinsic base region, and the forming an LTO-1 sidewall around the emitter fingers are all carried out in accordance with the process of the first embodiment described above.

Figure 12:
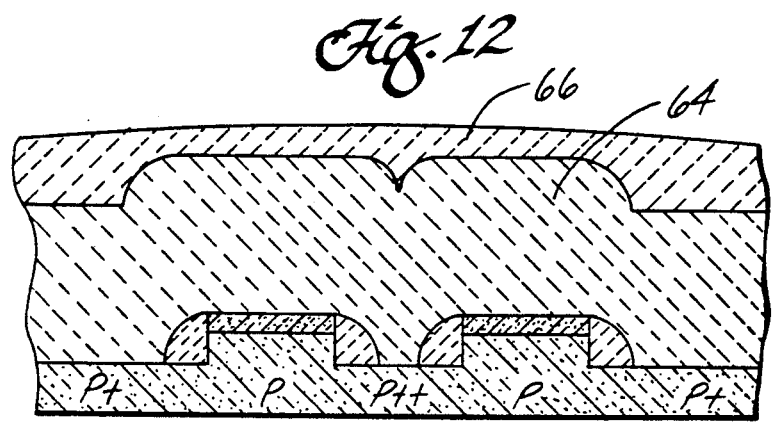
FIG. 12 is a partial side sectional view of a partially processed bipolar transistor after depositing oxide and spin-on-glass layers in a second embodiment of the present invention.

In the second embodiment, metal deposition for the purpose of forming a silicide in the extrinsic base region is not necessary. Shallow boron implantation is carried out over the extrinsic base region 60 and between the LTO-1 sidewalls 62, as shown by the arrows in FIG. 11. An LTO-2 layer 64 and SOG layer 66 are deposited and planarized on top of the wafer, as shown in FIG. 12.

Figure 13:
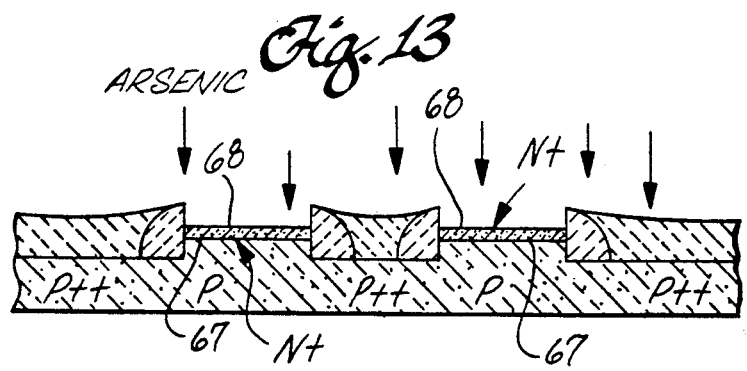
FIG. 13 is a partial side sectional view of a partially processed bipolar transistor after etching the oxide layer in a second embodiment of the present invention.

An etchback process is then used to expose the NIT layer, which is subsequently etched away exposing the silicon in the emitter finger region 66, as shown in FIG. 13. An upper portion 68 of the exposed silicon 66 is then implanted, preferably with arsenic (shown by arrows), in a self-aligned fashion, i.e. without using a mask.

Figure 14:
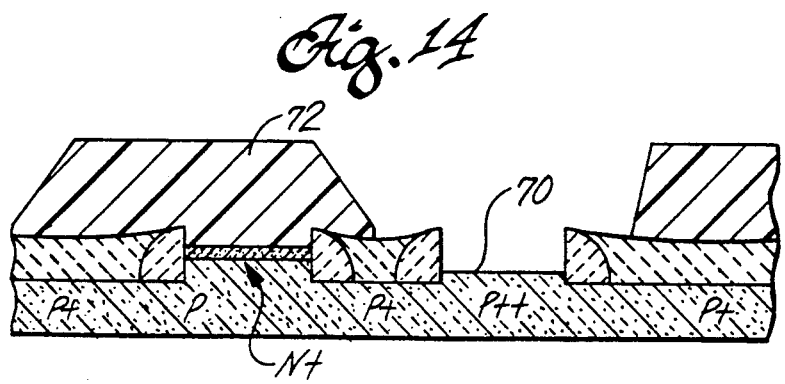
FIG. 14 is a partial side sectional view of a partially processed bipolar transistor having a base contact mask after etching of the implanted arsenic from the base contact in a second embodiment of the present invention.

If two regions were initially defined, one becomes the emitter while the other becomes the base contact. If three regions were initially defined, the one in the center becomes the emitter and the other two become the base contacts. Alternatively, the center region can become the base and the outer two regions can become the emitters. As illustrated in FIG. 14, the arsenic implanted in the base contact region 70 is removed by: first, covering the emitter region with a lithographically defined photoresist mask 72; second, carrying out a silicon etch, such that the arsenic implanted silicon is removed from the base contact region 70. A typical etch depth for this purpose is approximately 500 to 1000 angstroms.

The base contact area is then boron implanted in a self-aligned fashion using a dosage of approximately 1E15 to 5E15 cm$^{-3}$ at approximately 5 to 20 KeV to reduce the sheet resistance of the base contact area while using only one mask.

Figure 15:
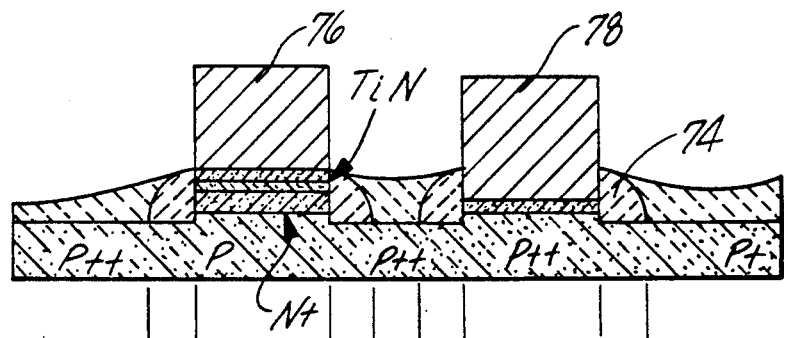
FIG. 15 is a partial side sectional view of a finally processed bipolar transistor in a second embodiment of the present invention.
Figure 16:
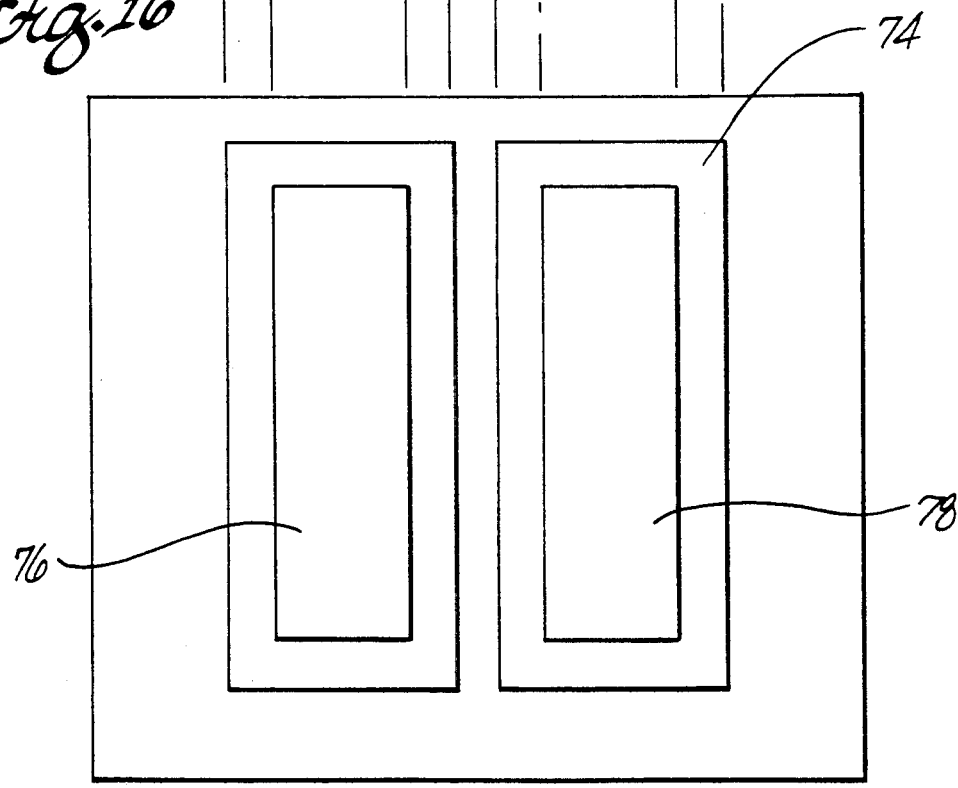
FIG. 16 is a partial top view of a finally processed bipolar transistor in a second embodiment of the present invention.

After removal of the photoresist mask, a final diffusion step is then carried out to activate the dopant atoms, anneal any damage and drive-in the junctions, after which the emitter and base contact metalization is carried out. The final emitter-base structure configuration of the second embodiment of the invention is illustrated in FIGS. 15 and 16. The resulting structure has a complete oxide wall 74 surrounding both the emitter and base contact regions 76 and 78.

Figure 17:
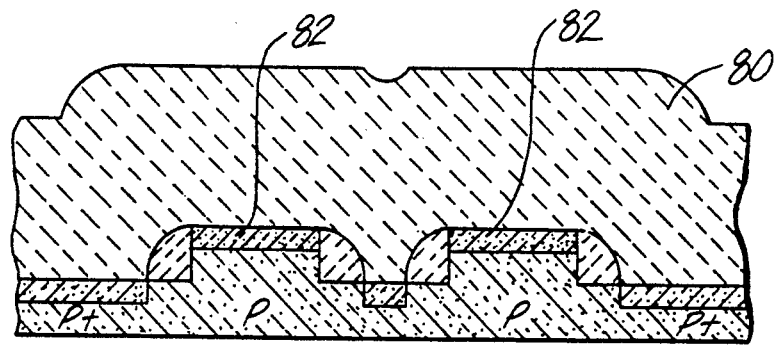
FIG. 17 is a partial side sectional view of a partially processed bipolar transistor having a second oxide layer in a third embodiment of the present invention.

A third embodiment of the invention is the same as the first embodiment up until the step of depositing a SOG layer on top of the LTO-2 layer. In the third embodiment, as shown in FIG. 17, the LTO-2 layer 80 is thicker than what is used in the first embodiment, preferably approximately 7000 to 10,000 angstroms. The thicker LTO-2 layer 80 makes it unnecessary to follow the LTO-2 deposition with a planarizing polymer or SOG.

Figure 18:
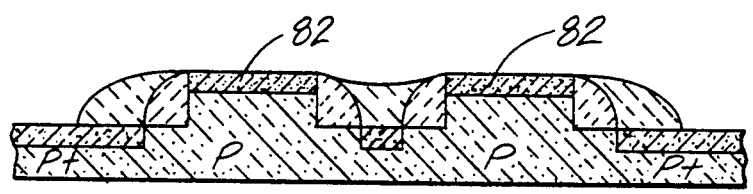
FIG. 18 is a partial side sectional view of a partially processed bipolar transistor after etching the second oxide layer in a third embodiment of the present invention.
Figure 19:
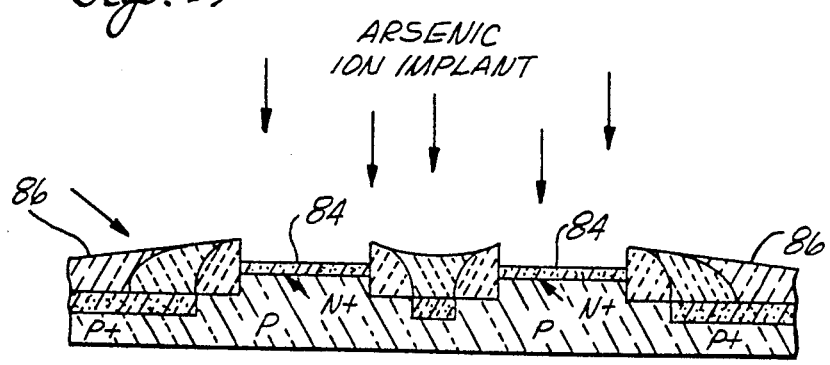
FIG. 19 is a partial side sectional view of a partially processed bipolar transistor showing arsenic implantation in the emitter region after selectively etching the silicon nitride layer in a third embodiment of the present invention.

The LTO-2 layer 80 is then etched by RIE until the NIT layer 82 in the emitter region is exposed, as shown in FIG. 18. Next, the NIT layer 82 is selectively etched by either wet or dry techniques. The extrinsic base region is then covered with a photoresist film 86, as shown in FIG. 19, and the emitter region is selectively dry etched, for example using O2, until the bare silicon is exposed. The upper portion 84 of the silicon in the emitter area is then ion implanted (shown by arrows), preferably with arsenic.

The photoresist is etched away, and a final diffusion step is then carried out at approximately 900° to 1000° C. to activate the dopant atoms, anneal any damage and drive-in the junctions. The structure is then finished by carrying out the emitter 90 and base contact 92 metalization as was already described with reference to the first embodiment.

Alternatively, the need for film 86 can be avoided by performing base and emitter implantation earlier in the process.

The final device structure created in the third process embodiment of the invention is shown in FIGS. 20 and 21. In FIG. 21 LTO-1 sidewall 94 completely surrounds the active emitter area 96. The LTO-1 sidewall 94 is completely surrounded by the LTO-2 sidewall 98 which covers most of the extrinsic base area over the metal silicide. The base contact areas 100 near the outer edges of the base island region do not contain the LTO-2 sidewall material 98, so that the metal silicide is exposed and in contact with the base metal 92.

A fourth embodiment of the invention is the same as those mentioned above, except that the passivation of the extrinsic base region is carried out using thermal oxidation. Instead of depositing an oxide layer, thermal oxidation is used to create an oxide layer in the etched silicon area, i.e. the extrinsic base area, surrounding the emitter region.

Figure 22:
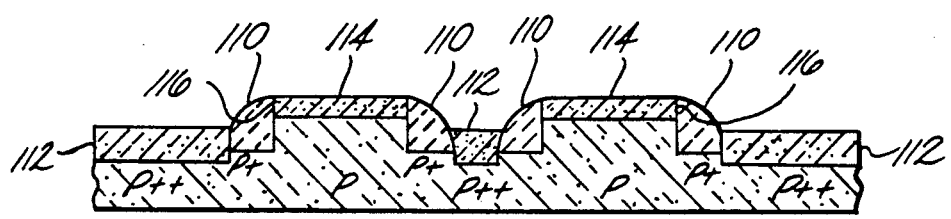
FIG. 22 is a partial side sectional view of a partially processed bipolar transistor after thermal oxidation of exposed silicon in a fourth embodiment of the present invention.
Figure 23:
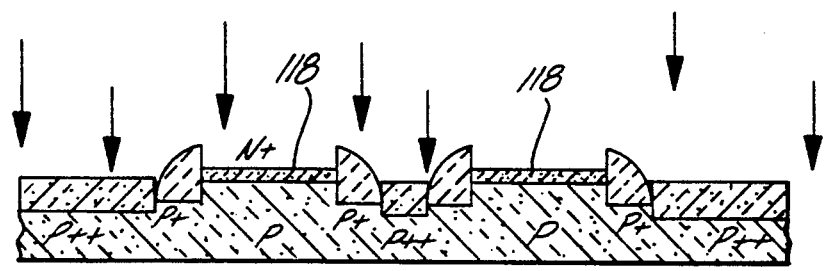
FIG. 23 is a partial side sectional view of a partially processed bipolar transistor after etching the nitride and thin-oxide layers in a fourth embodiment of the present invention.

Two variations of the fourth embodiment are described with reference to FIGS. 22-24. In the first variation, processing is performed as in the second embodiment until the step after etching the first LTO-1 layer, 110 in FIG. 22. Next, the exposed silicon in the extrinsic base area 112 is thermally oxidized, preferably at approximately 750° to 900° C. using pressure which is high enough to achieve a reasonably fast oxidation rate. The NIT 114 and THINOX 116 layers are then etched, and the upper portion 118 of the exposed silicon in the base island region is ion implanted, preferably with arsenic, as shown by the arrows in FIG. 23. The formation of the emitter and base contacts and metalization is carried out substantially as described above with reference to the other embodiments of the invention.

As shown in FIG. 24, the second variation of the fourth embodiment employs thermal oxidation to create a fully walled emitter-base structure without depositing any oxide material, such as LTO-1 or LTO-2 which were employed in the other embodiments. After defining the emitter region 119, the extrinsic base region 120 is thermally oxidized as described above in the first variation of the fourth embodiment. A boron (BF$_2$) implant is then carried out in the extrinsic base region 120, since the THINOX 122 and NIT 124 layers will protect the emitter region. The process is then completed substantially as described in the other embodiments.

Passivation by thermal oxidation as employed in the fourth embodiment has the advantage of requiring fewer process steps relative to the other embodiments, to create the oxide wall around the emitter-base structure. It is preferable to use relatively low temperatures, for example 750° to 900° C., in conjunction with high-pressure oxidation in order to have reasonable oxidation rates and to minimize dopant diffusion.

The drawbacks of the fourth embodiment compared to the first three embodiments are: 1) thermal oxidation tends to "suck-up" the boron from the base region due to dopant impurity segregation which results in increased base resistance; 2) silicides cannot be formed on the extrinsic base region since thermal oxidation of silicides would result in too thin an oxide layer and increased silicon resistance; 3) thermal oxidation using the second variation, i.e. no sidewalls, results in lateral encroachment of the emitter since the oxidation will also occur laterally, as shown in FIGS. 24 and 25. In some cases, the lateral encroachment of the emitter region may be considered an advantage since thinner emitters may be desirable.

A fifth method embodiment of the present invention is illustrated in FIGS. 25-31. The primary modification in this embodiment is that the base and emitter ion implantation steps are performed in the beginning of the process prior to defining the emitter region. By employing this approach, substantially the same structure as was produced by the third method embodiment can be realized without having to perform base and emitter ion implantation steps at the end of the process.

As shown in FIG. 25, after an N-type epitaxial collector layer 130 is grown, base and emitter ion implantation is performed producing a P-type base layer 132 and an N+ emitter layer 134. The ion implantation techniques are selected so that the P-type base layer will be deeper than the N+ emitter layer.

Subsequent process steps to deposit THINOX and NIT layers, to define the emitter region, and to form the LTO-1 and LTO-2 layers and sidewalls are performed substantially as previously described for the third embodiment. In FIG. 26, a photoresist 140 is used to define the emitter region 141. In the extrinsic base region 142, the upper silicon N+ layer is completely etched, leaving the P-type base layer 132 exposed. Typically 1200 to 1800 angstroms of silicon etch is sufficient.

Figure 27:
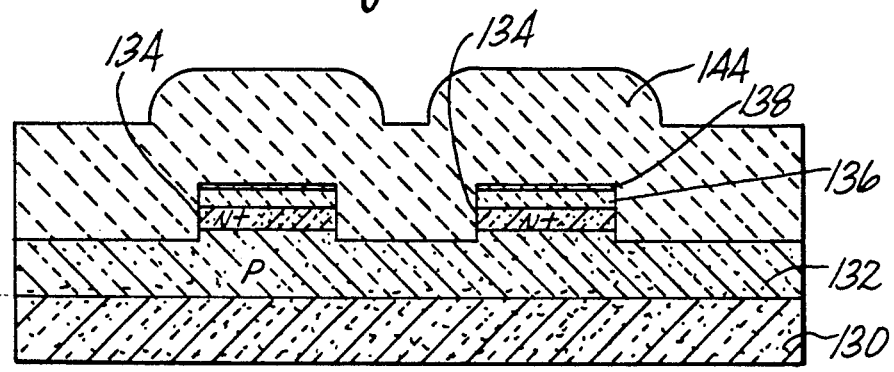
FIG. 27 is a partial side sectional view of a partially processed bipolar transistor after deposition of the first oxide film in the fifth embodiment of the present invention.

The photoresist 140 is then removed, and a shallow boron implant is performed. As shown in FIG. 27, the entire base island region is then covered by a conformal LTO-1 film 144. Throughout these process steps the N+ emitter layer 134 is protected by the THINOX 136 and NIT 138 layers which cover the emitter region 141.

Figure 28:
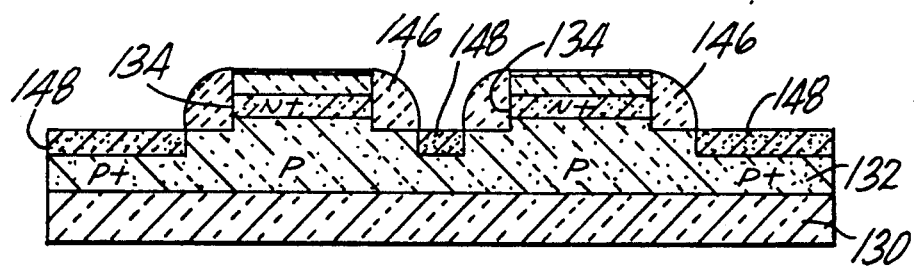
FIG. 28 is a partial side sectional view of a partially processed bipolar transistor after forming a metal silicide in the extrinsic base region in the fifth embodiment of the present invention.

An RIE etch is carried out to form the sidewalls 146, as shown in FIG. 28. A refractory metal, for example Ti, is then sputtered over the base island region, to a thickness of approximately 400 to 1000 angstroms. A shallow boron implant using BF$_2$ is carried out. The wafer is annealed to form a metal silicide 148 in the extrinsic base region, followed by wet etching of the unreacted refractory metal.

Figure 29:
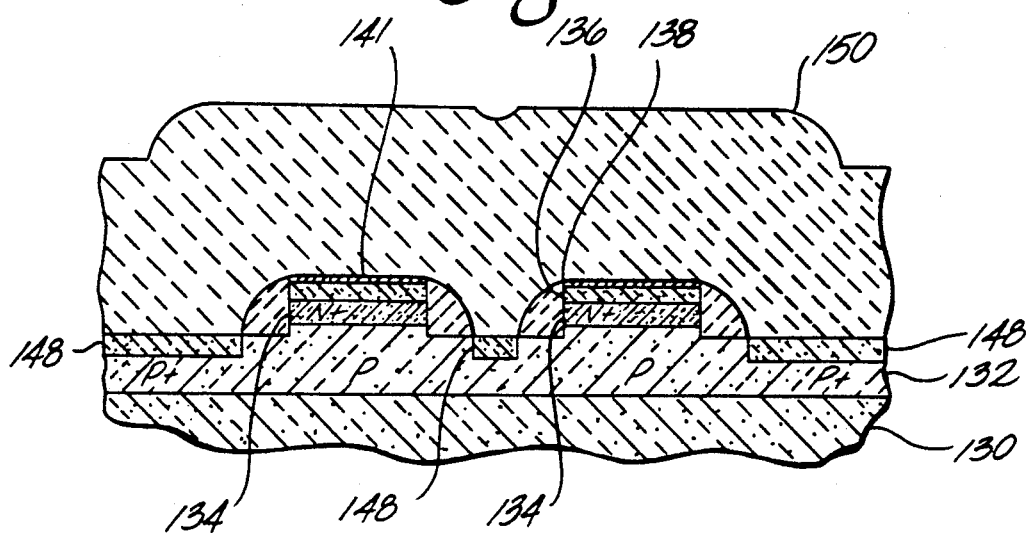
FIG. 29 is a partial side sectional view of a partially processed bipolar transistor after deposition of the second oxide film in the fifth embodiment of the present invention.

As shown in FIG. 29, a conformal LTO-2 layer 150 is deposited to a thickness of approximately 7,000 to 10,000 angstroms. The oxide layers are then densified, preferably using 800° to 900° C. steam.

Figure 30:
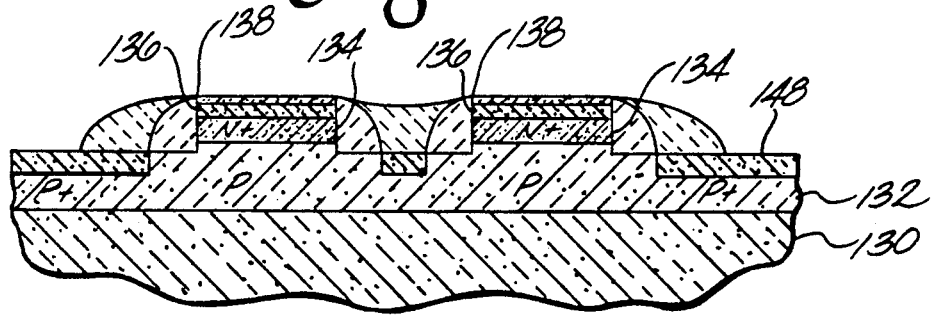
FIG. 30 is a partial side sectional view of a partially processed bipolar transistor after etching the second oxide layer in the fifth embodiment of the present invention.

The LTO-2 film is etched by RIE until the nitride layer 138 in the emitter region 141 and the metal silicide 148 in the extrinsic base region is exposed, as shown in FIG. 30.

Figure 31:
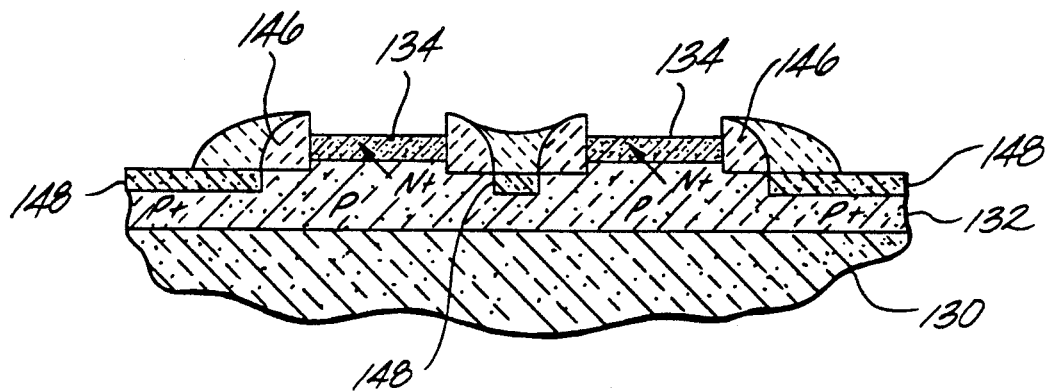
FIG. 31 is a partial side sectional view of a partially processed bipolar transistor after etching the nitride layer in the emitter region in a fifth embodiment of the present invention.

The emitter-base structure is then completed by selectively etching, by wet or dry techniques, the NIT layer 138 and the THINOX layer 136, rendering the structure shown in FIG. 31. Base contacts 92 and emitter contacts 96 may then be created to form the final structure shown in FIGS. 20 and 21, without performing any further ion implantation steps.

Figure 32:
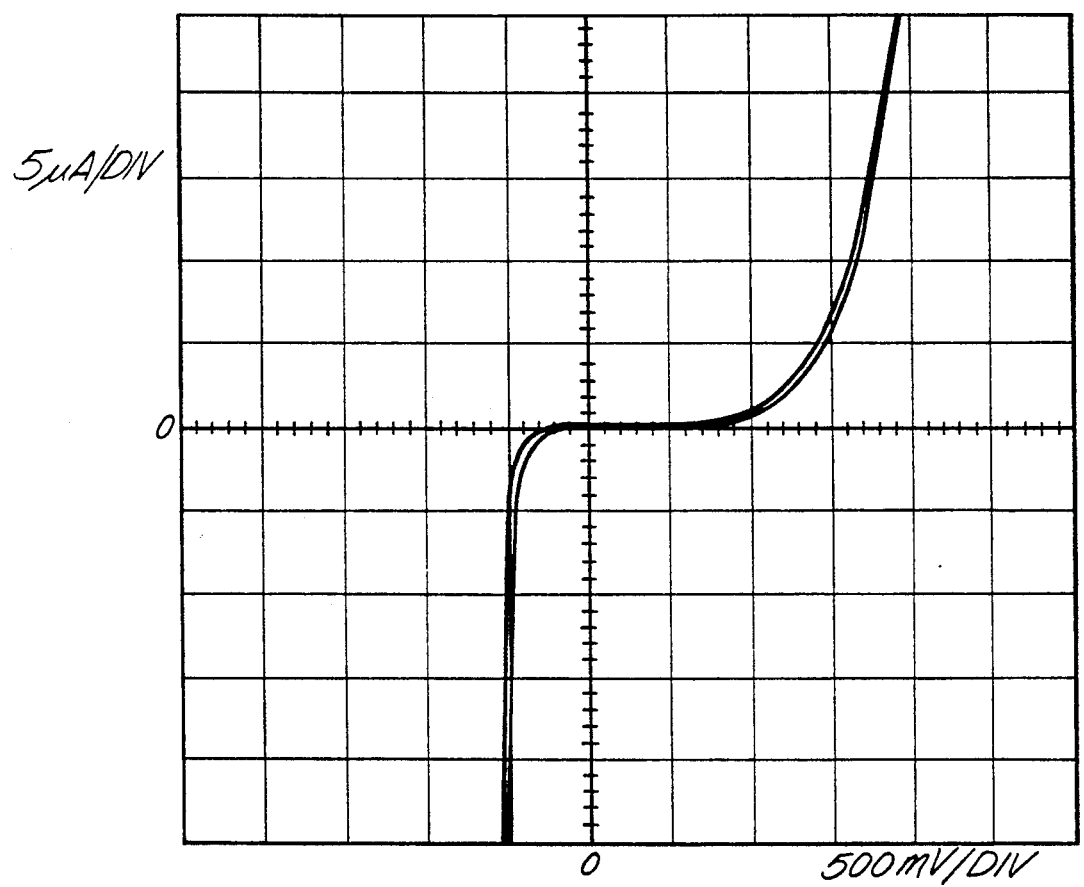
FIG. 32 is a graphics plot showing the emitter base breakdown for a non-walled transistor.
Figure 33:
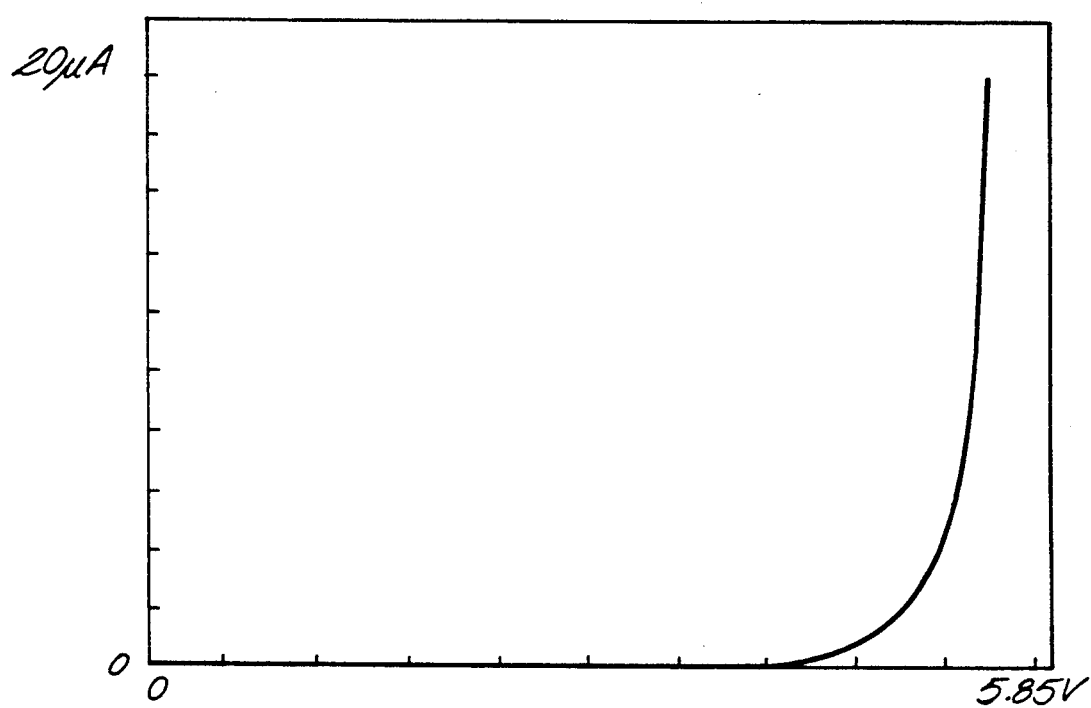
FIG. 33 is a graphics plot showing the emitter base breakdown for a walled transistor.

FIGS. 32-34 show experimental results demonstrating some advantages of walled emitter-base structures compared to non-walled structures. FIG. 32 shows that a standard AT214 (non-walled) transistor has an emitter-base breakdown voltage of 1.6 V at 10 microamps. In comparison, FIG. 33 shows that an AT214 transistors having a fully walled emitter-base structure according to the present invention, have an emitter-base breakdown voltage of 5.4 V. The increased breakdown voltage of the walled structure is believed to be caused by the elimination of high doping levels at the emitter periphery. A transistor having a high emitter-base breakdown voltage is particularly useful in certain circuit applications such as totem pole output stages and BiCMOS gates.

The Table in FIG. 34 includes data comparing capacitance measurements for transistors having walled and non-walled emitter-base structures. The data shows that the transistors having a walled emitter-base structure have nearly half the capacitance of comparable non-walled structures. The decreased capacitance is believed to be due to the elimination of the emitter sidewall parasitic effects, i.e. high doping levels and oxide passivation of the emitter periphery.

The claimed invention is not intended to be limited to the preferred embodiments described above. For example, the present invention is not limited to discrete devices. Nor is it necessarily limited to silicon based technologies. The invention may be applied to structures having multiple emitter or base contacts. Although the preferred embodiments which have been described are NPN devices, the claimed invention is equally applicable to PNP devices.

Further, the claimed invention is not necessarily limited to the use of a monocrystalline emitter. For example, a silicon carbide emitter may be deposited prior to the deposition of the THINOX and NIT layers to result in a fully walled self-aligned silicon carbide emitter heterojunction bipolar transistor.

Devices with fully walled emitter-base structures having polysilicon contacted emitters may also be realized using the described method. Such devices would have improved performance when compared to the prior art since the new method allows for coverage of the entire emitter surface with the metal electrode with no emitter-base short circuits while also realizing emitters which are fully surrounded by a low resistance base layer.

What is claimed is:

1. A method for producing a fully walled emitter-base structure for a bipolar transistor comprising the steps of:
   defining a monocrystalline silicon emitter region within a base island region wherein the emitter region is raised relative to the surrounding base island region;
   forming an extrinsic base in the base island region;
   producing an oxide wall surrounding the raised emitter region for isolating the emitter from the extrinsic base; and
   contacting substantially the entire monocrystalline silicon emitter region with an emitter metal contact which overlaps at least a portion of the oxide wall.

2. The method of claim 1 wherein the producing step includes the steps of:
   depositing an oxide film over the base island region; and
   etching the oxide film to produce a sidewall wherein the raised emitter region has an outer surface, the oxide film contacting substantially the entire outer surface of the raised emitter region.

3. The method of claim 2 further comprising the step of:
   depositing a nitride layer over the emitter region prior to depositing the oxide film.

4. The method of claim 2 wherein the oxide film has a thickness of approximately 1000 to 3000 angstroms.

5. The method of claim 1 wherein the producing step includes the step of:
   applying a nitride layer over the emitter region; and
   thermally oxidizing the base island region surrounding the raised emitter region.

6. The method of claim 5 further comprising the steps of:
   depositing an oxide film over the base island region; and
   etching the oxide film to produce an oxide sidewall, wherein the raised emitter region has an outer surface, the etched oxide film contacting substantially the entire outer surface of the raised emitter region, the depositing and etching steps being performed prior to the applying and oxidizing steps.

7. The method of claim 2 further comprising the steps of:
   applying a thin nitride layer over the emitter region;
   depositing a metal over the base island region after the oxide etching step; and
   reacting the metal to form a silicide over substantially the entire base island region outside of the emitter region.

8. The method of claim 7 wherein the metal is selected from the group consisting of Ti, Ni, Co, and Pt.

9. The method of claim 7 further comprising the steps of:
   depositing a second oxide film over the entire base island region after the metal reacting step; and
   etching the second oxide film until the thin nitride layer over the emitter region is exposed.

10. The method of claim 9 wherein the thickness of the second oxide film is approximately 3000 to 9000 angstroms.

11. A method for producing a fully walled emitter-base structure for a bipolar transistor comprising the steps of:
    providing a base island region on a semiconductor device having an epitaxial monocrystalline silicon layer under a thin oxide layer and thin nitride layer;
    introducing base dopant into the monocrystalline silicon layer;
    defining an emitter region by lithographically patterning a photoresist mask on top of the oxide and nitride layers;
    directionally etching the unmasked area until all of the oxide and nitride layers and part of the silicon layer are removed, so that the etching depth of the silicon layer corresponds to the desired emitter-base junction depth;
    removing the photoresist mask from on top of the emitter region;
    introducing base dopant into the unmasked areas of the base island region;
    depositing a first oxide film over the base island region, the first oxide film having a thickness of approximately 1000 to 3000 angstroms;
    directionally etching the first oxide film until an oxide sidewall is formed surrounding the emitter region;
    introducing base dopant into the exposed silicon region of the base island region;
    depositing a second oxide film over the base island region, the second oxide film having a thickness of approximately 3000 to 9000 angstroms;
    planarizing the second oxide film with a spin-on film;
    etching the spin-on film and the second oxide layer until the thin nitride layer over the emitter region is exposed;
    thermally densifying the first and second oxide layer material which is remaining in the base island region;
    selectively wet etching away the oxide layer and the nitride layer on top of the emitter region;
    implanting the emitter region;
    establishing and implanting a base contact region; and
    creating electrodes over the emitter and base contact regions.

12. The method of claim 11, further comprising the steps of:
   depositing a layer of metal selected from the group consisting of Ti, Ni, Co, and Pt, over the entire base island region, after the step of directionally etching the first oxide film; and
   reacting the metal layer to form a silicide in the exposed monocrystalline silicon regions.

13. The method of claim 11, further comprising the step of:
   depositing a silicon nitride film having a thickness of approximately 600 to 1000 angstroms over the base island region, prior to the step of defining the emitter region.

14. The method of claim 13 wherein the emitter and base implanting steps are performed prior to depositing the silicon nitride film over the base island region.

15. A method for producing a fully walled emitter-base structure for a bipolar transistor comprising the steps of:
   providing a base island region on a semiconductor device having an epitaxial monocrystalline silicon layer under a thin oxide layer and a thin nitride layer;
   introducing base dopant into the monocrystalline silicon layer;
   defining an emitter region by lithographically patterning a photoresist mask on top of the oxide layer and the nitride layer;
   directionally etching the unmasked area until all of the oxide layer, the nitride layer and part of the silicon layer are removed, so that the etching depth of the silicon layer corresponds to the desired emitter-base junction depth;
   removing the photoresist mask from the emitter region;
   introducing base dopant in the unmasked areas of the base island region;
   depositing a first oxide film over the base island region, the first oxide film having a thickness of approximately 1000 to 3000 angstroms;
   directionally etching the first oxide film until an oxide sidewall is formed surrounding the emitter region;
   depositing a layer of metal selected from the group consisting of Ti, Ni, Co, and Pt, over the entire base island region; and
   introducing base dopant into the exposed silicon region of the base island region;
   reacting the metal layer to form a silicide in the exposed monocrystalline silicon region.
   depositing a second oxide film over the base island region, the second oxide film having a thickness of approximately 3000 to 9000 angstroms;
   densifying the second oxide film;
   etching the second oxide layer until the thin nitride layer over the emitter region and the silicided monocrystalline silicon in the base island region are exposed;
   selectively wet etching away the thin oxide layer and the thin nitride layer on top of the emitter region;
   implanting the emitter region;
   establishing and implanting a base contact region; and
   contacting an emitter metal electrode with the monocrystalline silicon in the emitter region, and creating a metal base electrode in the base contact region.

16. The method of claim 15 further comprising the step of:
   densifying the first oxide film prior to directionally etching it.

17. The method of claim 1 comprising the steps of:
   forming a metal silicide electrically conductive layer on the extrinsic base;
   forming a metal silicide electrically conductive layer on the monocrystalline silicon emitter region having a thickness less than the thickness of the silicide layer on the extrinsic base.

18. The method of claim 1 comprising the steps of:
   forming a metal silicide electrically conductive layer on the extrinsic base;
   forming an electrically insulating layer over substantially all of the metal silicide layer; and
   depositing a metal emitter contact layer over the electrically insulating layer and in direct contact with substantially the entire monocrystalline silicon emitter region.

19. A method for producing a fully walled emitter-base structure for a bipolar transistor comprising the steps of:
   defining a monocrystalline silicon emitter region within a base island region wherein the emitter region is raised relative to the surrounding base island region;
   forming a transistor base in the base island region;
   producing an oxide wall surrounding the raised emitter region for isolating the emitter from the base;
   forming a metal silicide layer on the base;
   covering substantially the entire silicide layer with an oxide layer; and
   depositing a metal emitter contact over the oxide layer over the base, over the oxide wall, and into direct contact with the monocrystalline silicon emitter.

20. The method of claim 19 further comprising the step of forming a second metal silicide layer between the monocrystalline silicon emitter and the metal emitter contact, the second metal silicide layer being thinner than the first metal silicide layer on the base.

* * * * *